(12) United States Patent
Oh

(10) Patent No.: US 6,297,992 B1
(45) Date of Patent: Oct. 2, 2001

(54) EPROM WRITING CIRCUIT

(75) Inventor: Hyung-Seog Oh, Chungwon-Kun (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/605,714

(22) Filed: Jun. 27, 2000

(30) Foreign Application Priority Data

Jul. 30, 1999 (KR) .................................................. 99-31322

(51) Int. Cl.[7] .................................................. G11C 16/06
(52) U.S. Cl. .............................. 365/185.25; 365/185.18; 365/185.23
(58) Field of Search ................. 365/185.25, 185.23, 365/185.18, 185.01

(56) References Cited

U.S. PATENT DOCUMENTS

| | | | |
|---|---|---|---|
| 4,581,672 | 4/1986 | Lucero | 361/18 |
| 5,173,874 | * 12/1992 | Kobatake | 365/185.21 |
| 6,058,051 | * 5/2000 | Iwahashi | 365/189.11 |

* cited by examiner

Primary Examiner—Hoai V. Ho
(74) Attorney, Agent, or Firm—Fleshner & Kim, LLP

(57) ABSTRACT

An EPROM writing circuit including: a cell array consisting of an EPROM cell; a word line decoder and a bit line decoder for respectively decoding an address and a writing signal and enabling corresponding word lines and bit lines among a plurality of word lines and bit lines; a level sensing unit for sensing a level of an inputted booster voltage and outputting a level sensing signal; a decoding unit for ANDing the level sensing signal and the writing signal and outputting it; a first, a second and a third power switches enabled by the decoding signal, for supplying the sensed voltage to a voltage distribution unit; a voltage distribution unit enabled by the output voltage of the power switches, for stepping down the booster voltage to a different voltage level and outputting it; and a switching unit for outputting the stepped-down voltage to the cell array, by which degradation of the EPROM gate due to the excessive writing which is caused when the applied voltage Vpp is high is prevented and the problem in that the writing time becomes excessively lengthened when the applied voltage Vpp is low is automatically prevented.

22 Claims, 3 Drawing Sheets

EPROM WRITING CIRCUIT

BACKGROUND OF THE INVENTION

1. Field of the Invention

The present invention relates to a memory device, and more particularly, to an EPROM writing circuit in which a voltage level to be applied to an EPROM in EPROM writing is varied and applied to a bit line of a EPROM cell.

2. Description of the Background Art

FIG. 1 is a circuit diagram showing a construction of a general EPROM writing circuit in accordance with a conventional art.

As shown in the drawing, the EPROM writing circuit includes: a cell array 10 having a plurality of EPROM cells; a word line decoder 20 for decoding a writing signal Wpgm and an inputted address (addr[7:0]) and selecting a corresponding word line among a plurality of word lines (wl0~wl15); a bit line decoder 30 for decoding the writing signal Wpgm and an inputted address (Addr[7:0]) and selecting a corresponding bit line among a plurality of bit lines BL0~BL15; a power switch 40 switched by the writing signal Wpgm and supplying a voltage to the voltage distribution unit 50; a voltage distribution unit 50 for suitably stepping down a booster voltage by the voltage Vps outputted from the power switch 40 and outputting it; and a switching unit 60 selected by the output signal of the bit line decoder 30 and outputting the voltage stepped down by the voltage distribution unit 50 to the cell array 10.

FIG. 2 is a view of showing a detailed construction of the power switch unit 40.

The power switch unit 40 includes an inverter Inv1 for inverting the writing signal Wpgm, a PMOS transistor PM1 and an NMOS transistor NM1 and a PMOS transistor PM2 and an NMOS transistor NM2, which are constructed in parallel and connected in series between the booster voltage Vpp and the ground voltage Vss.

The voltage distribution unit 50 includes NMOS transistors NM10 and NM11 which are connected in series between the booster voltage Vpp and the first node V1. The voltage distribution unit 50 is enabled by the output voltage Vps of the power switch 40 so as to output a stepped-down voltage to the switching unit 60.

The switching unit 60 includes a plurality of NMOS transistors NM21~NM36, and transmits an output voltage of the voltage distribution unit 50 to the bit line of the EPROM cell through a gate selected by the writing signal Wpgm and the bit line address decoder 30.

The writing operation of the general EPROM cell in accordance with the conventional art will now be described with reference to FIGS. 1 and 2.

When the address Addr[7:0] is applied to the word line decoder 20 and the bit line decoder 30, the word line decoder 20 and the bit line decoder 30 are enabled by the writing signal Wpgm and decode the address addr [7:0] to thereby select corresponding word line and bit line among the plurality of word lines WL0~WL15 and the bit lines BL0~BL15, respectively.

Here, if a low level writing signal Wpgm is applied, the word line decode 20 and the bit line decoder 30 are disabled upon receipt of it, the power switch 40 and the NMOS transistor NM1 are turned off upon receipt of it, and the NMOS transistor NM2 and the PMOS transistor PM1 are turned on, according to which the power switch 40 outputs the ground voltage Vss.

Meanwhile, if a high level writing signal Wpgm is applied, the word line decoder 20 and the bit line decoder 30 are enabled upon receipt of it, to output word line WL0~WL15 signals and bit line signals BL0~BL15.

At this time, the NMOS transistor NM1 is turned on as the high level writing signal Wpgm is applied thereto, and at the same time, the NMOS transistor NM2 is turned off as the inverted writing signal is applied thereto, according to which the PMOS transistor PM2 is turned on so that the power switch 40 outputs the booster voltage Vpp.

Accordingly, the voltage distribution unit 50, which receives the high level signal of the power switch 40 by the commonly connected gates, steps down the booster voltage applied to the drain as the NMOS transistors NM10 and NM11 that are connected in series, and outputs it.

Upon receipt of the voltage stepped down by the voltage distribution unit 50 through the first node V1, the switching unit 60 outputs it to corresponding bit lines through the NMOS transistors NM21~NM36 enabled by the signal of the bit line decoder 30 among the plurality of NMOS transistors NM21~NM36, and applies the booster voltage Vpp to the corresponding EPROM cell of the cell array 10 enabled by the word line WL0~WL15 signals of the word line decoder 20, thereby performing writing operation.

Writing time in the EPROM cell is determined by the voltage level of the word line WL0~WL15 signals and bit line BL0~BL150 signals.

However, the booster voltage Vpp is applied to the corresponding word lines WL0~WL15 as it is and the step-own voltage, that was lowered down by the voltage distribution unit 50, is applied to the bit lines BL0~BL15. Consequently, when the higher voltage than or the same voltage as that of the gate is applied to the drain of the EPROM cell, since the hot electron accelerated at the source is not trapped to the floating gate of the EPROM cell but flows to the drain, writing operation is not performed. On the other hand, if the drain voltage is lower than the gate voltage, no hot electron is generated, causing that the writing time is much increased.

SUMMARY OF THE INVENTION

Therefore, an object of the present invention is to provide an EPROM writing circuit in which a voltage to be applied to a bit line is adjusted according to variation of a EPROM writing voltage and applied to a bit line of an EPROM cell, thereby maintaining a uniform writing time.

To achieve these and other advantages and in accordance with the purposed of the present invention, as embodied and broadly described herein, there is provided an EPROM writing circuit having a cell array 10, a word line decoder 20, a bit line decoder 30 and a switching unit 60; including a level sensing unit 100 for sensing a voltage level and outputting a first and a second detection signals 'A' and 'B' according to the level; a decoding unit 200 for logically operating the first and the second detection signals 'A' and 'B' of the level sensing unit 100 and outputting the same; a first, a second and a third power switches 301, 302 and 303 being enabled by the output signal and a writing signal of the decoding unit 200 and supplying a voltage; and a voltage distribution unit 400 for stepping down a booster voltage Vpp to a different voltage level by the output signal Vps1~Vps3 of the first, the second and the third power switches 301, 302 and 303 and outputting the same.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
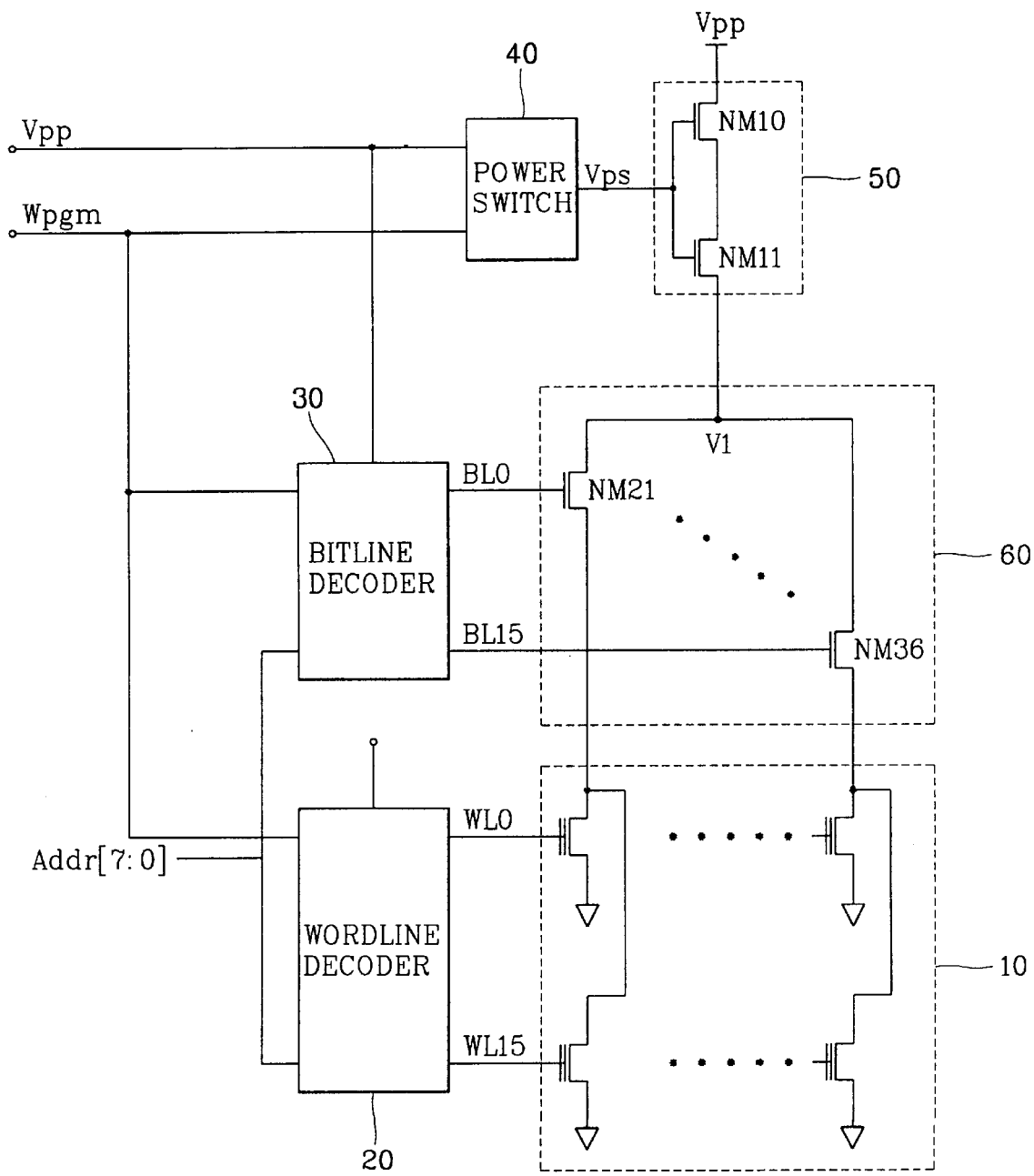
FIG. 1 is a circuit diagram of an EPROM writing circuit in accordance with a conventional art.
Figure 2:
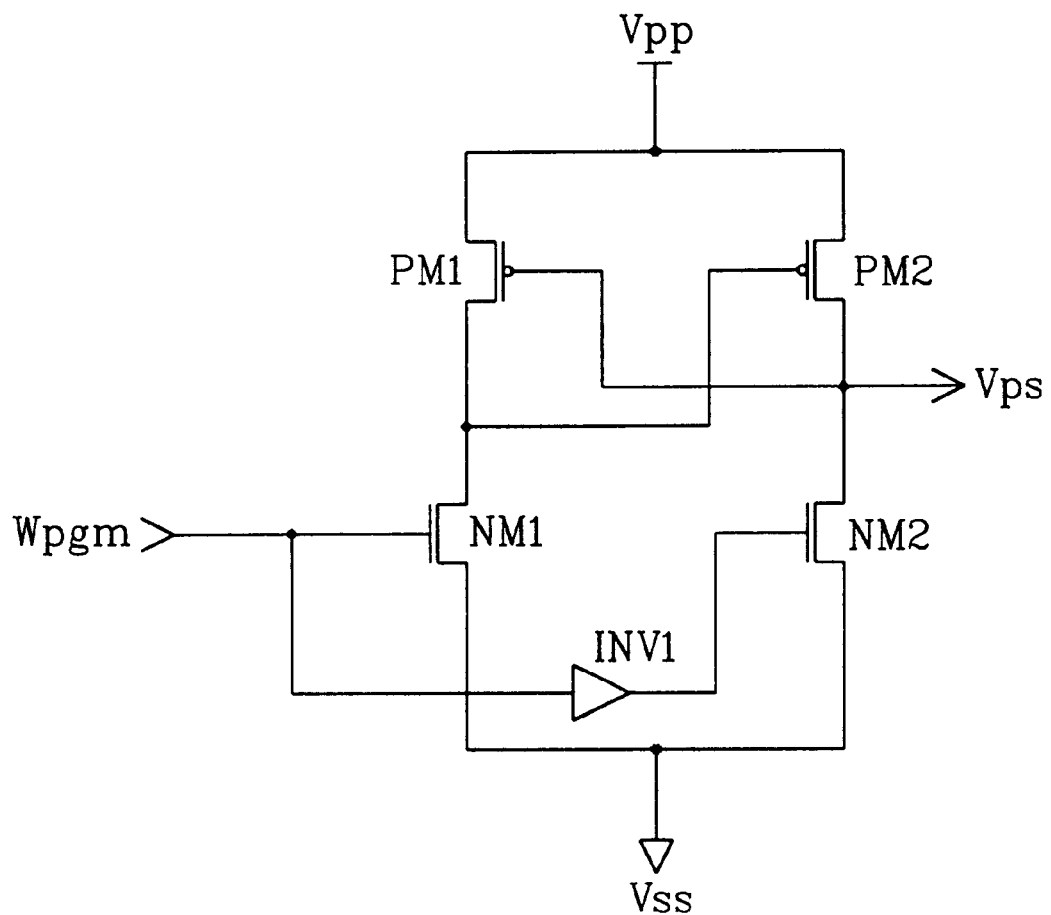
FIG. 2 is a circuit diagram showing a power switch of FIG. 1 in accordance with the conventional art.
Figure 3:
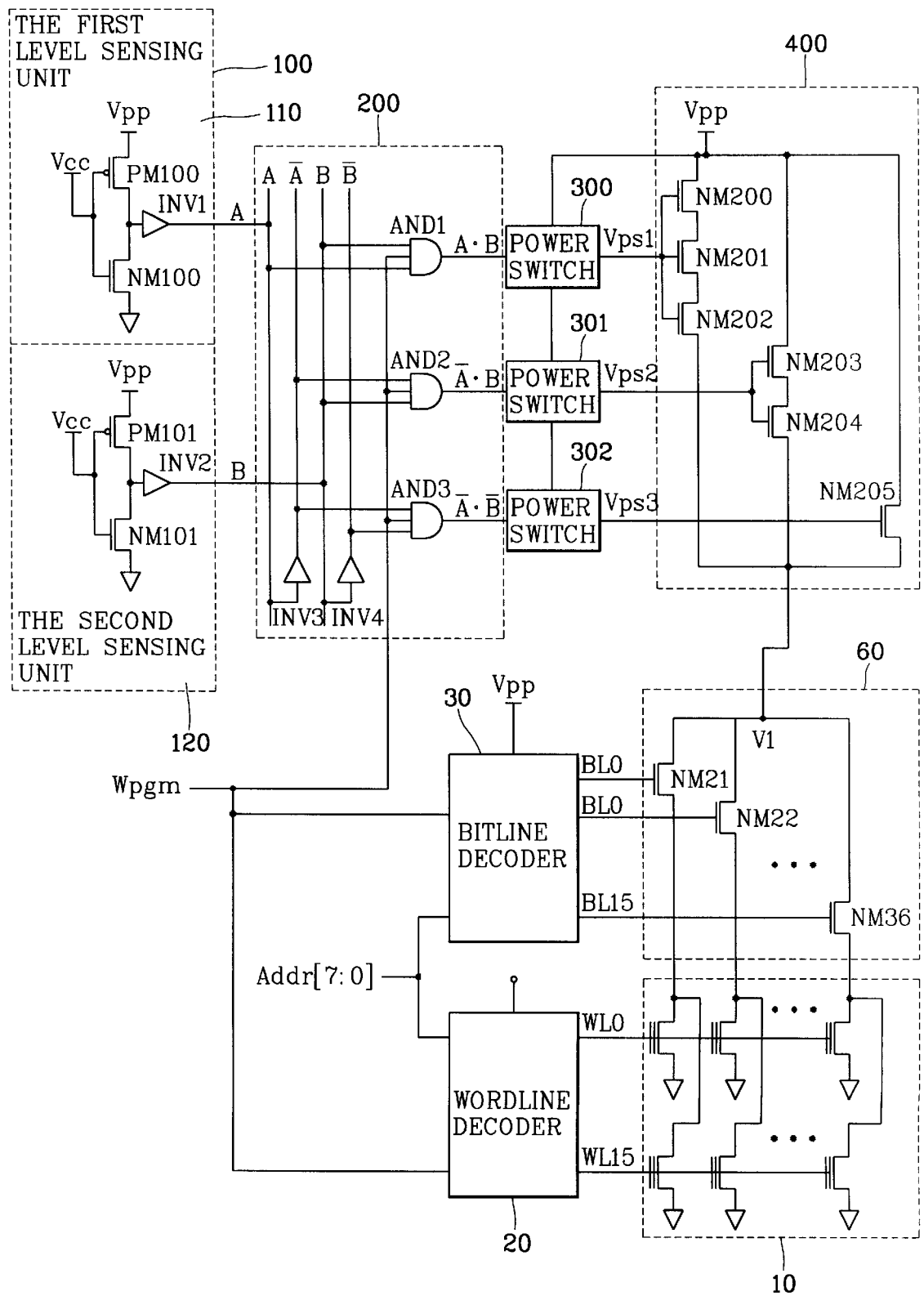
FIG. 3 illustrates an EPROM writing circuit in accordance with the present invention.

FIG. 3 illustrates an EPROM writing circuit in accordance with the present invention.

As shown in the drawing, the construction elements of the cell array 10, the word line decoder 20, the bit line decoder 30 and the switching unit 60 are the same as in the conventional art, descriptions for which are omitted and the same reference numerals are taken as it is in the description of the present invention.

Having the same general construction elements, the EPROM writing circuit includes a level sensing unit 100 for sensing a voltage level and outputting a first and a second detection signals 'A' and 'B' according to the level; a decoding unit 200 for logically operating the first and the second detection signals 'A' and 'B' of the level sensing unit 100 and outputting the same; a first, a second and a third power switches 301, 302 and 303 being enabled by the output signal and a writing signal Wpgm of the decoding unit 200 and supplying a voltage; and a voltage distribution unit 400 for stepping down a booster voltage Vpp to a different voltage level by the output signals Vps1~Vps3 of the first, the second and the third power switches 301, 302 and 303 and outputting the same.

The level sensing unit 100 includes a first level sensing unit 110 and a second level sensing unit 120. The first level sensing unit 110 includes a PMOS transistor PM100 and an NMOS transistor NM100 which receive the power supply voltage Vcc to their commonly connected gates. The PMOS transistor PM100 and the NMOS transistor NM100 are connected in series between the booster voltage Vpp applied to the source and the ground voltage Vss.

The second level sensing unit 120 includes a PMOS transistor PM101 and an NMOS transistor NM101 which receive the power supply voltage Vcc by the commonly connected gates and are connected in series between the booster voltage Vpp applied to its source and the ground voltage Vss.

Also, there is provided a first and second inverters INV1 and INV2 for inverting a drain voltage of the PMOS transistors PM100 and PM101 and the NMOS transistors NM100 and NM101 and outputting a first and a second sensing signals 'A' and 'B'. The level sensing can be made in a manner that the PMOS transistor PM100 of the first sensing unit 110 is smaller in size than the PMOS transistor PM101 of the second sensing unit 120 so that their threshold voltages are different to each other.

The decoding unit 200 includes inverters INV3 and INV4 for inverting and outputting the sensing signals 'A' and 'B'; a first AND gate AND1 for receiving and ANDing a writing signal Wpgm and the sensing signals 'A' and 'B'; a second AND gate AND2 for receiving and ANDing the writing signal Wpgm, the output signal of the inverter INV3 and the sensing signal 'B'; and a third AND gate AND3 for receiving and ANDing the writing signal and the output signals of the inverters INV3 and INV4.

The power switches 300~302 are enabled by the step-up voltage Vpp and the output values of the AND gates AND1~AND3 of the decoding unit 200, and generates the output voltages Vps1~Vps3 according to the result of decoding so as to enable at least one NMOS transistor of the voltage distribution unit 400.

The voltage distribution unit 400 includes a plurality of serially connected NMOS transistors NM200~NM202 enabled by the output signal Vps1 of the first power switch 300 that is applied to the commonly connected gates, so as to control the booster voltage; a plurality of serially connected NMOS transistors NM203 and NM204 enabled by the output signal Vps2 of the second power switch that is applied to the commonly connected gates, so as to control the booster voltage Vpp; and an NMOS transistor NM205 enabled by the output signal of the third power switch 302 that is applied to the commonly connected gates, so as to control the booster voltage Vpp.

The operation of the EPROM writing circuit in accordance with the present invention constructed as described above will now be explained with reference to the accompanying drawings.

When the booster voltage Vpp is stably applied and a high level writing signal Wpgm is applied, the word line decoder 20 and the bit line decoder 30 that have received the address (addr[7:0]) having the address information of the EPROM cell 10 intended to store a data are enabled by the writing signal Wpgm to decode the address (addr[7:0]), and respectively output word line signal and bit line signal to select the corresponding word lines WL0~WL15 and bit lines BL0~BL15.

At this time, the level sensing unit 100 senses the level of the booster voltage Vpp by dividing three regions.

In case that the level of the booster voltage Vpp is below 12 V, the second sensing unit is turned on because difference between the power supply voltage Vcc and the booster voltage Vpp between its gate and its source is very small, so that the booster voltage Vpp is inverted by the inverters INV1 and INV2 and the low potential sensing signals 'A' and 'B' are outputted.

After receiving the low potential sensing signals 'A' and 'B', the inverters INV3 and INV4 respectively invert them and output them with a high level signal, which are respectively received by the plurality of AND gates AND1~AND3, of which the AND gate AND3 outputs a high level signal after receiving the high potential writing signal Wpgm and the output signals of the inverters INV3 and INV4.

And, upon receipt of the high potential output signal of the AND gate AND3, the power switch 302 is enabled and outputs the output voltage Vps3 to the NMOS transistor NM205 of the voltage distribution unit 400, so that the NMOS transistor NM205 is turned on, according to which the booster voltage Vpp applied to the drain is stepped-down to be outputted.

In case that the booster voltage Vpp level is between 12 V~13 V, the PMOS transistor PM100 is turned on because the voltage difference between the gate and the source is quite small and the PMOS transistor PM101 is turned off, so that the booster voltage Vpp and the ground voltage Vss are inverted through the respective inverters INV1 and INV2, thereby outputting the low potential sensing signal 'A' and the high potential sensing signal 'B'.

And, after receiving the sensing signals 'A' and 'B', the inverters INV3 and INV4 respectively invert them and output a high potential and a low potential, which are received by the plurality of AND gates AND1~AND3, respectively, of which the AND gate AND2 outputs a high potential after receiving the high potential writing signal Wpgm, the level sensing signal and output signal of the inverter.

Accordingly, the second power switch 301 receiving the high level signal of the AND gate AND2 is enabled to turn on the serially connected NMOS transistors NM203 and NM204 of the voltage distribution unit 400, to step-down the booster voltage Vpp and output it.

Meanwhile, in case that the booster voltage Vpp level is more than 13 V, the PMOS transistors PM100 and PM101 are turned off, so that the booster voltage Vpp is inverted by the inverters INV1 and INV2 to output high potential sensing signals 'A' and 'B', and the power switch 300 is enabled upon receipt of the high potential output signal of the AND gate AND1 which had received the sensing signals 'A' and 'B', and turns on the plurality of serially connected NMOS transistors NM200–NM202 of the voltage distribution unit 400, to thereby step down the booster voltage and output it.

Accordingly, the voltage distribution unit 400, which received the output signals Vps1~Vps3 of the plurality of power switches 300~302 enabled by the signal which decoded the sensing signals 'A' and 'B' that had sensed the voltage level of the booster voltage Vpp, steps down the voltage level of the booster voltage Vpp to a voltage level suitable to the writing condition of the EPROM cell, to output it, and the plurality of NMOS transistors which received the stepped down voltage at its drain output it to the corresponding bit line through the NMOS transistor enabled by the bit line signal, the stepped-down voltage is applied to the EPROM cell of the cell array enabled by the word line signal, thereby performing writing operation.

As so far described, according to the EPROM writing circuit of the present invention, degradation of the EPROM gate due to the excessive writing which is caused when the applied voltage Vpp is high is prevented and the problem in that the writing time becomes excessively lengthened when the applied voltage Vpp is low is automatically prevented as well.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. An EPROM writing circuit comprising:
   a cell array consisting of an EPROM cell;
   a word line decoder and a bit line decoder for respectively decoding an address and a writing signal and enabling corresponding word lines and bit lines among a plurality of word lines and bit lines;
   a level sensing unit for sensing a level of a booster voltage and outputting a level sensing signal;
   a decoding unit for logically processing the level sensing and the writing signal and outputting a decoding signal;
   a first, a second and a third power switches enabled by the decoding signal, for switching the sensed booster voltage;
   a voltage distribution unit enabled by an output voltage of the power switches, for selectively stepping down the booster voltage to a different voltage level and outputting it; and
   a switching unit for outputting the stepped-down booster voltage to the cell array.

2. The circuit according to claim 1, wherein the level sensing unit includes a first level sensing unit, a second level unit and an inverter.

3. The circuit according to claim 2, wherein the first level sensing unit includes a PMOS transistor and an NMOS transistor being serially connected between the booster voltage applied to the source and the ground voltage, the PMOS transistor and the NMOS transistor receiving a power supply voltage by the commonly connected gates.

4. The circuit according to claim 2, wherein the second level sensing unit includes a PMOS transistor and an NMOS transistor being serially connected between the booster voltage applied to its source and a ground voltage, the PMOS transistor and the NMOS transistor receiving a power supply voltage by the commonly connected gates.

5. The circuit of claim 2, wherein a PMOS transistor of the first level sensing unit is smaller than that of the second level sensing unit, so that their threshold voltages become different, to thereby sense the voltage.

6. The circuit according to claim 1, wherein the decoding unit ANDs the writing signal and the level sensing signal of the level sensing unit and selects a power switch suitable to the sensed booster voltage level.

7. The circuit according to claim 1, wherein the voltage distribution unit steps down a voltage by using at least one transistor according to the sensed booster voltage level and transmits it to the bit line.

8. The circuit according to claim 1, wherein the voltage distribution unit includes:
   at least two serially connected NMOS transistors enabled by the output signal of the first power switch which is applied to commonly connected gates thereof, so as to step down the booster voltage;
   at least two serially connected NMOS transistors enabled by the output signal of the second power switch which is applied to commonly connected gates thereof, so as to step down the booster voltage; and
   at least two serially connected NMOS transistors enabled by the output signal of the third power switch which is applied to commonly connected gates thereof, so as to step down the booster voltage.

9. The circuit according to claim 1, wherein the decoding unit includes:
   a first and a second inverters for inverting first and second sensing signals of the level sensing unit and outputting them;
   a first AND gate for receiving the writing signal and the first and the second sensing signals and ANDing them;
   a second AND gate for receiving the output signal of the first inverter and the second sensing signal and ANDing them;
   a third AND gate for receiving the writing signal and the output signals of the first and the second inverters and ANDing them.

10. A method of operating an EPROM writing circuit comprising:
   sensing whether a booster voltage of a level sensing unit is below 12V, between 12V and 13V, or more than 13V to determine a sensing signal;
   decoding the sensing signal and selecting a corresponding power switch;

outputting a voltage stepped down as many as serially connected transistors of a voltage distribution unit according to the output of the selected power switch; and supplying the stepped down voltage to a specified EPROM cell of a decoded address.

11. The method according to claim 10, wherein in the sensing, in case that the booster voltage level is more than 13V, first transistors of the level sensing unit are all disabled, so that a high potential sensing signal is outputted through an inverter, and a first power switch is enabled as the selected power switch.

12. The method according to claim 10, wherein the sensing, in case that the booster voltage level is between 12V and 13V, a PMOS transistor of a first level sensing unit is turned on because the voltage difference is small, wherein a PMOS transistor of a second level sensing unit is turned off, so that the booster voltage and a ground voltage are inverted to respectively output a low potential sensing and a high potential sensing signal from the first and second level sensing units, and an intermediate power switch is enabled as the selected power switch.

13. The method according to claim 10, wherein the sensing, in case that the booster voltage level is below 12V, a first transistor of the level sensing unit is turned on, so that the booster voltage is inverted by an inverter to output a low potential sensing signal, and a low power switch is enabled as the selected power switch.

14. The method according to claim 10, wherein the outputting the stepped-down voltage, the stepped-down voltage is supplied to the bit line through at least one transistor according to the booster voltage sensed by the level sensing unit.

15. A bit line apply voltage variable-type EPROM writing circuit comprising:

a level sensing unit for detecting a level of a booster voltage;

a decoding unit for enabling a power switch according to the detected booster voltage level; and a voltage distribution unit selected by the power switch according to the output of the decoding unit, so that a voltage suitably stepped-down by the voltage distribution unit is applied to a bit line of an EPROM cell.

16. The circuit according to claim 15, wherein the level sensing unit includes a first level sensing unit, a second level sensing unit and an inverter, the first level sensing unit having a PMOS transistor and an NMOS transistor being serially connected between the booster voltage and a ground voltage, the PMOS transistor and the NMOS transistor each receiving a power supply voltage by commonly connected gates, the second level sensing unit having a PMOS transistor and an NMOS transistor being serially connected between the booster voltage and the ground voltage, the PMOS transistor and the NMOS transistor of the second level sensing unit receiving the power supply voltage by commonly connected gates, and the inverter inverting an output value of the level sensing units.

17. The circuit according to claim 15, wherein the decoding unit includes:

a first and a second inverters for inverting a first and a second sensing signals of first and second level sensing units and outputting them;

a first AND gate for receiving a writing signal and the first and the second sensing signals and ANDing them;

a second AND gate for receiving the writing signal, the output signal of the first inverter and the second sensing signal and ANDing them; and a third AND gate for receiving the writing signal and the output signals of the first and the second inverters and ANDing them.

18. The circuit according to claim 15, wherein the voltage distribution unit includes:

three serially connected transistors enabled by an output signal of a first power switch that is applied to commonly connected gates, to step down a first booster voltage;

two serially connected transistors enabled by the output signal of a second power switch that is applied to commonly connected gates, to step down a second booster voltage; and a transistor enabled by the output signal of a third power switch applied to its gate, to step down a third booster voltage, wherein one of the first, second and third power switches are enabled by the decoding unit as the power switch.

19. The circuit according to claim 16, wherein in the level sensing unit the PMOS transistor of the first level sensing unit is smaller than that of the second level sensing unit, so that their threshold voltages become different, to thereby sense the booster voltage.

20. The circuit according to claim 15, wherein the power switch is selected according to a level signal output by the level sensing unit, wherein when the level signal is a high voltage signal, a first plurality of three transistors are enabled, wherein when the level signal is a low voltage signal, one transistor is enabled, and wherein when the level signal is between the high voltage and low voltage, a second plurality of two transistors are enabled.

21. The circuit according to claim 20, wherein with respect to the transistors, they can be varied in number to make a step-down voltage according to the booster voltage.

22. A method of operating an EPROM writing circuit comprising:

sensing whether a booster voltage of a level sensing unit is below a first prescribed voltage, between the first prescribed voltage and a second prescribed voltage, or more than the second prescribed voltage to determine a sensing signal;

decoding the sensing signal and selecting a corresponding switch;

outputting a voltage stepped down by as many serially connected transistors of a voltage distribution unit as selected according to an output of the selected corresponding switch; and supplying the stepped down voltage to a specified EPROM cell of an address selected by a decoder.

* * * * *